United States Patent [19]

Mueller et al.

[11] Patent Number: 5,017,871
[45] Date of Patent: May 21, 1991

[54] GRADIENT CURRENT SPEED-UP CIRCUIT FOR HIGH-SPEED NMR IMAGING SYSTEM

[75] Inventors: Otward M. Mueller, Ballston Lake; Peter B. Roemer; William A. Edelstein, both of Schenectady, N.Y.

[73] Assignee: General Electric Company, Schenectady, N.Y.

[21] Appl. No.: 407,180

[22] Filed: Sep. 14, 1989

[51] Int. Cl.$^5$ .................................. G01R 33/20
[52] U.S. Cl. .................................. 324/318; 324/322
[58] Field of Search .................. 323/268–272, 323/274–277, 280, 283–285, 349–351; 324/300, 318, 319, 320, 322

[56] References Cited

U.S. PATENT DOCUMENTS

| | | | |
|---|---|---|---|
| 4,437,053 | 3/1984 | Bax | 324/322 |
| 4,612,596 | 9/1986 | Fox | 324/322 |
| 4,701,711 | 10/1987 | Willard | 324/322 |
| 4,733,342 | 3/1988 | Mueller | 324/322 |

Primary Examiner—Michael J. Tokar
Attorney, Agent, or Firm—Larry P. Zale; James C. Davis, Jr.; Marvin Snyder

[57] ABSTRACT

A gradient current speed-up circuit, for use in a higher-speed NMR imaging system with a gradient power amplifier and an associated gradient, coil, has a high-voltage power supply which is selectively connected to the associated gradient coil, typical via a plurality of semiconductor switching elements, to supply a pulse of a very high voltage when fast coil rise and fall times are needed. The gradient coil is connected between selected ones of semiconductors devices which are turned on and off in selected patterns, to cause the direction of coil current flow to be determined.

20 Claims, 2 Drawing Sheets

GRADIENT CURRENT SPEED-UP CIRCUIT FOR HIGH-SPEED NMR IMAGING SYSTEM

BACKGROUND OF THE INVENTION

The present invention relates to nuclear magnetic resonance (NMR) imaging systems and, more particularly, to a novel circuit for speeding up the rise and fall times of current pulses utilized to generate gradient magnetic fields in such systems.

It is now well known that NMR imaging and/or spectroscopy systems require at least one power amplifier for each magnetic gradient field direction utilized. These gradient power amplifiers provide the current which generates the magnetic gradient fields, typically in the X,Y and Z dimensions of a Cartesian coordinate system, as necessary to obtain desired spatial resolution. Typically, the gradient power amplifiers are modified forms of linear high-fidelity audio power amplifiers, which typically generate current pulses in the 100–200 ampere range; the relatively good linearity, rise times and fall times of these amplifiers are obtained by the application of relatively high voltages and feedback to output stages containing as many as 100 bipolar transistors. These power amplifiers are relatively inefficient (having typical efficiencies of less than 15%). As higher imaging speeds are utilized, greater electrical stress is applied to existing gradient power amplifiers, as faster rise times require greater voltages (across the same gradient coil inductance) and so increasingly higher voltages and more power dissipation are all required. It is therefore highly desirable to provide a current amplifier circuit, preferably capable of being added to an NMR system in addition to, and between, an existing gradient power amplifier and its associated gradient coil, for providing the faster pulse current waveform rise and fall times necessary for higher-speed imaging use.

BRIEF SUMMARY OF THE INVENTION

In accordance with the invention, a gradient current speed-up circuit for use in a higher-speed NMR imaging system having an associated gradient coil, comprises: at least one gradient power amplifier receiving an input analog signal controlling amplifier output current; a plurality of semiconductor switching elements receiving the total output of the at least one amplifier; means for connecting the associated gradient coil between selected ones of the semiconductor devices; means for turning the semiconductor devices on and off in selected patterns, to cause the amplifier current to be suddenly applied to and removed from flow through the associated gradient coil; and means for providing a high voltage to said semiconductor devices when the gradient coil current lags behind an amplitude commanded by the input signal.

In a presently preferred embodiment, an insulated gate bipolar transistor (IGBT) is utilized to provide a high voltage switch for connecting a high-voltage power supply to the connecting means whenever a high-speed change in gradient coil current is required.

Accordingly, it is an object of the present invention to provide a novel gradient current speed-up circuit for use in NMR imaging and spectroscopy systems.

This and other objects of the present invention will become apparent upon reading of the following detailed description, when considered in conjunction with the associated drawings.

DETAILED DESCRIPTION OF THE INVENTION

Figure 1:
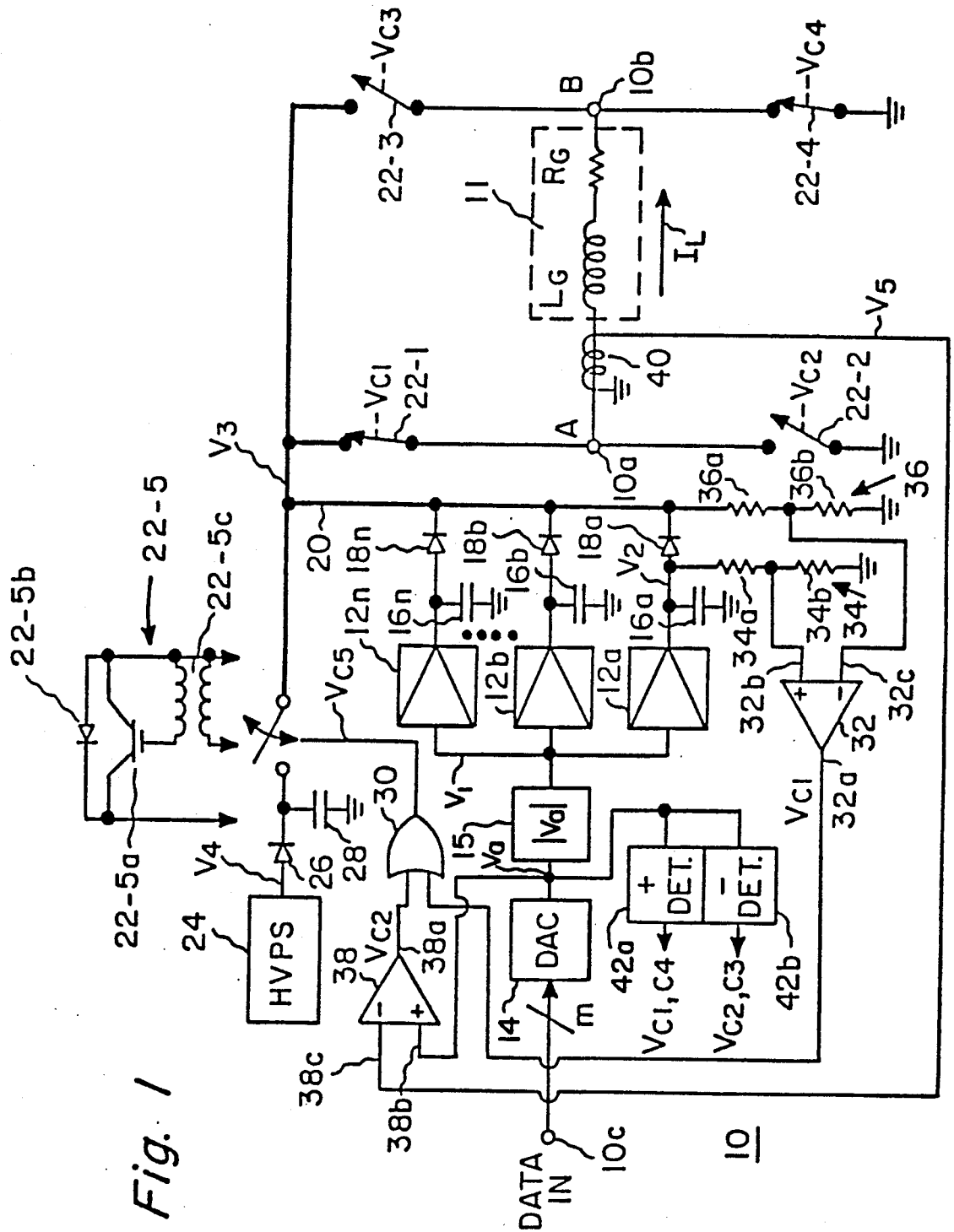
FIG. 1 is a schematic block diagram of a single directional-gradient-magnetic-field-providing portion of a NMR system, and of a presently preferred embodiment of the novel circuit of the present invention.
Figure 2:
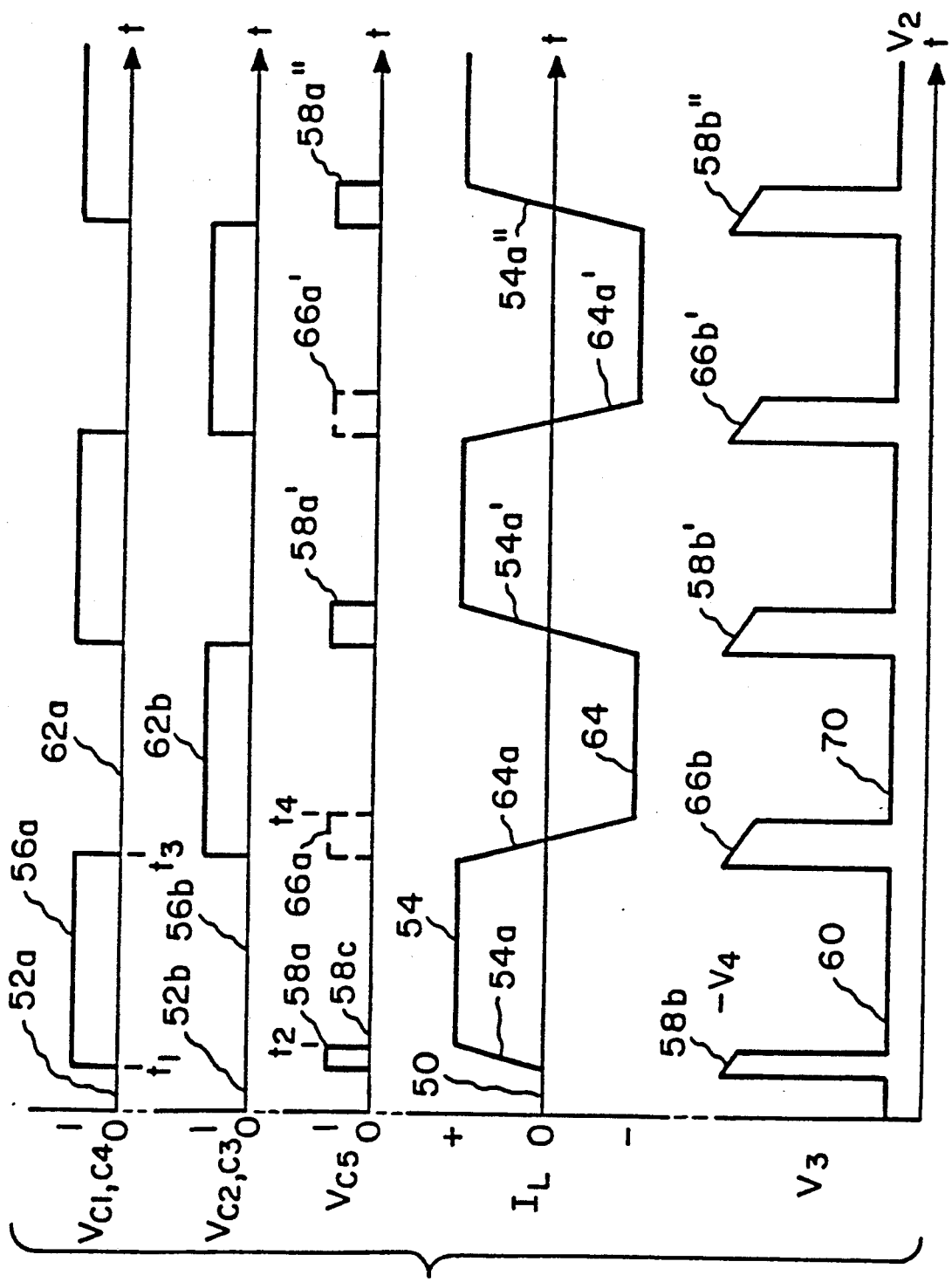
FIG. 2 is a time-synchronized set of signals found in the circuit of FIG. 1 and useful in appreciating operation thereof.

Referring initially to FIG. 1, a presently preferred embodiment of our gradient current speed-up circuit 10 is utilized with an associated gradient coil 11, connected between circuit A and B terminals 10a and 10b, for providing the magnetic-field gradient in one (of a plurality) of directions within the operating volume of a NMR imaging and/or spectroscopy system. Gradient coil 11 is driven by at least one gradient power amplifier 12, and typically, in order to generate the large currents needed, by a parallel connected set of a plurality N of gradient amplifiers 12a–12n. One possible gradient power amplifier is the model 8607 unipolar power supply manufactured by Tecron; a maximum output voltage of about 160 volts and a peak output current of about 130 amperes is typical for such amplifier/supply units. The input of each gradient parallel amplifier 12 receives, in parallel, an analog input voltage $V_1$; (here, of positive polarity). This voltage may be provided by the analog output of a digital-to-analog converter (DAC) means 14, receiving an m-bit digital data input control signal at a circuit input 10c, and an absolute-value amplifier 15 for converting a bipolar $V_a$ output of DAC 14 to the unipolar $V_1$; input required by amplifier 12. The unipolar output of each gradient pair amplifier 12 stores charge in an associated storage element, e.g. associated storage capacitor 16a–16n. The anode of an associated unilaterally-conducting element (e.g. a diode) 18a–18n is connected to each gradient pair output, with the cathodes thereof all connected in parallel to a common bus 20. At least one gradient amplifier output provides a monitorable voltage $V_2$. Bus 20 has a voltage $V_3$ thereon; this voltage is unipolar. A plurality of power switching means 22 control the direction of the flow of gradient current $I_L$ through the gradient coil 11, so that current here always leaves from bus 20 and goes to circuit common potential. In one presently preferred configuration, four switch means 22-1 through 22-4 (which may each be a semiconductor switching element with a paralleled commutating diode) are utilized in a full-bridge configuration; thus, a first power switching means 22-1, controlled by a first control voltage $V_{C1}$, is connected between bus 20 and circuit first output terminal A, which is controllably connected to circuit common potential through the controlled circuit of a second power switching means 22-2, itself controlled by a second independent control voltage $V_{C2}$. Similarly, upper and lower power switching means 22-3 and 22-4 are connected in series between bus 20, second output B and circuit common potential, and are respectively operated by independent control voltages $V_{C3}$ and $V_{C4}$. The first and fourth control voltages $V_{C1}$ and $V_{C4}$ are typically substantially simultaneously switched between the "on" and "off" conditions, while the second and third control voltages $V_{C2}$ and $V_{c3}$ are typically complementary thereto.

A high voltage power supply 24 provides output voltage $V_4$, to the anode of another unidirectionally-conducting device 26, e.g. a diode, for providing charge to a storage element 28 (e.g., a capacitor). The diode 26-capacitor 28 junction is connected to one terminal of a fifth switching means 22-5, having its other terminal connected to bus 20, and controlled between its "open" and "closed" positions by another independent control voltage $V_{C5}$, which may be provided at the output of an OR gate 30 to be responsive to at least one of a pair of input signals. A high voltage switch means 22-5 can, if the other switch means 22 are formed of controlled semiconductor switching devices such as at least one insulated-gate by polar transistor (IGBT) and the like, also be such a semiconductor device, e.g. an IGBT 22-5a with a controlled-conduction circuit connected in parallel with a reverse-poled diode 22-5b (which may itself be parasitic to device 22-5a) and driven through an isolation means 22-5c (such as an isolation transformer and the like) providing the drive voltage for device 22-5a responsive to the control voltage $V_{C5}$.

The high-voltage-control signal $V_{C5}$ may be responsive to the signal $V_{C1}$ at the output 32a of a first comparator means 32. A first comparator first (+) input 32b may receive a fixed proportion of the voltage $V_2$ at the output of a selected one of the gradient power amplifiers 12, by means of a potential divider 34 (such as provided by pair of resistors 34a and 34b connected in series between voltage $V_2$ and common potential, and with the input 32b signal taken from the junction therebetween). A first comparator second (−) input 32c may receive another potential, representative of the voltage on bus 20, as provided at the output of a second potential divider 36 (comprising series-connected resistors 36a and 36b, between bus 20 and common potential).

A second possible generator of the high-voltage switch control signal $V_{C5}$ may be the signal $V_{C2}$ at the output 38a of a second comparator 38, having a first (+) input 38b receiving the input analog signal Va and a second (−) 38c receiving a signal $V_5$ provided by a current monitor means 40, such as a pickup coil and the like, responsive to the magnitude of the gradient coil current $I_L$.

A positive-magnitude detector 42a monitors the $V_a$ signal, to provide an output for determining the logic level of power switch control signals $V_{C1}$ and $V_{C4}$, so that both switches 22-1 and 22-4 are non-conductive, or "open", when Va is negative (IL flow leftward) and are both conducting, or closed, when $V_a$ is positive (IL flow rightward) as shown by region 52a. The $V_a$ signal is also monitored by a negative-polarity detector means 42b, to provide control signal $V_{C2}$ and VC3, at logic levels such that switching devices 22-2 and 22-3 are substantially open for positive $V_a$ signals and conductive for negative $V_a$ magnitude.

In operation, at some time prior to a time $t_1$, the input analog voltage $V_a$ is substantially zero, indicative of a gradient coil 11 current $I_L$ of substantially zero magnitude (as in region 50) responsive to the substantially zero input analog signal $V_1$. Both detectors 42a/42b have low level outputs (as in regions 52a/52b) and all four of devices 22-1 through 22-4 are non-conductive. A positive-polarity gradient current IL peak 54 is to be provided at time $t_1$, with a fast-rise-time leading edge 54a. The analog input voltage $V_a$ abruptly becomes a positive voltage at time $t_1$, and the positive detector 42a provides high level $V_{C1}$ and $V_{C4}$ signals (in region 56a), closing switching means 22-1 and 22-4, so that output voltage A is substantially the bus voltage $V_3$ and output voltage B is substantially ground potential. Detector 42b causes $V_{C2}$ and $V_{C3}$ to be low (in region 52b) and devices 22-2 and 22-3 remain open. For a typical coil current $I_L$ of about 250 amperes, with a desired rise time of about 75 microseconds, a bus voltage $V_3$ in excess of 3300 volts is required. Since the typical output of a high current gradient power amplifier 12 (such as a Tecron model 8607 and the like) can only supply a few hundred volts, the current flow through coil 11 causes bus 20 voltage $V_3$ to be initially lower than required and the voltage at comparator input 32c is less than the voltage at comparator input 32b, providing a high-level output control voltage $V_{C1}$, which may be utilized to enable the high voltage switch control voltage $V_{C5}$. Alternatively, the low initial gradient coil current $I_L$ causes the voltage $V_5$ at the output of the current monitor means 40 to be much less than the input $V_a$ signal amplitude, causing the second comparator 38 output voltage $V_{C2}$ to be at a high logic level, enabling the fifth switch control voltage $V_{C5}$. In either case, $V_{C5}$ is enabled (region 58a) and switch means 22-5 is closed so that high voltage $V_4$ is suddenly connected to bus 20; thus, at a time very shortly after time $t_1$, the bus voltage $V_3$ suddenly jumps to high voltage $V_4$ (region 58b). The coil current $I_L$ quickly increases, with leading edge 54a, to the desired value of portion 54. It will be seen that the current pulse capacitor 28 supplies the additional current needed for charging coil inductance $L_G$ during rise time 54a. Having attained the commanded value, the output of both comparators returns to a low logic level signal, and the high voltage switching means command signal $V_{C5}$ returns to a low logic level (region 58c), causing switching means 22-5 to open; the bus 20 voltage $V_3$ falls, until diodes 18 conduct and the bus voltage is substantially equal to the high-current gradient current amplifier output voltage $V_2$, as shown in portion 60. The relatively high, but substantially constant, gradient coil current $I_L$ continues through the remainder of portion 54, as supplied by at least one gradient power amplifiers 12.

At some time $t_3$, the input signal $V_a$ voltage changes to a negative amplitude. The output of the positive polarity detector 42a falls for a low logic level, opening power devices 22-1 and 22-4, while the output of the negative-polarity detector 42b jumps to the high logic level, closing power devices 22-2 and 22-3 to effectively reverse the connection of gradient coil 11 between terminals A and B, and therefore reverse the flow of gradient coil current $I_L$ therethrough. It may not be necessary to close switching means 22-5 and apply a high-voltage pulse from supply 24, as the energy stored in the inductive portion $L_G$ of the gradient coil 11 may be put back into capacitor 28 during fall time 64a. Thus, the inductive action of the gradient coil may be sufficient to generate high voltage pulse 66b, which forward biases the parasitic diode 22-5b of the high voltage switching means 22-5, adding charge to storage device 28 (and also back-biasing diode 26, so that power supply 24 is effectively disconnected). The normal action of paralleled high-current, low-voltage gradient power supplies 12 provide the current in pulse 64, with the negative polarity of current flow in the gradient coil being responsive to the closure of switch means 22-2 and 22-3. It will be understood that first comparator 32 and/or second comparator 38 will continue to monitor the voltage on bus 20, and may, if necessary, cause the high voltage switching means 22-5 to receive a control voltage $V_{C5}$ pulse 66a, connecting high voltage power supply to bus 20, if necessary to carry out a high-speed falling edge 64a. If this occurs, upon cessation of the falling edge, at time $t_4$, the high voltage switching device control voltage $V_{C5}$ reverts to the low logic level and causes switch means 22-5 to open. Further inversions of the input signal $V_1$ will generally cause the high voltage switch to close on all positive-going edges 54a', 54a", ..., responsive to control pulses 58a', 58a", ..., to generating high voltage pulses 58b', 58b", ..., and so forth. Similarly, if fall-time reverse energy storage is useable, falling edge 4a' will not require a separate control pulse 66a', as the high voltage pulse 66b' will be generated by the gradient coil itself. Conversely, if a high voltage pulse 66b' is required from supply 24/storage capacitor 28, the control pulse 66a' will be generated by one or the other of comparators 32/38, for the duration of the necessary interval.

While several presently preferred embodiments of our novel invention have been described in detail herein, many modifications and variations will now become apparent to those skilled in the art. For example, while the presently preferred embodiment is illustrated with square-wave input signals and gradient coil currents, use of arbitrarily-varying signals is contemplated. It is our intent, therefore, to be limited only by the scope of the appending claims and not by the specific details and instrumentalities presented by way of explanation herein.

What is claimed is:

1. A current flow speed-up circuit for use with an associated gradient coil in a NMR imaging system, comprising:
    at least one gradient power amplifier, each having an input receiving a common input signal for controlling an output current;
    a plurality of switching elements connected to a common bus receiving a total output current from all of the at least one power amplifier;
    means for connecting the associated gradient coil between selected ones of the switching elements;
    means for operating the switching elements in selected patterns to cause the total output current to be selectively applied to and removed from the coil, responsive to a monitored characteristic of the input signal; and
    means for causing a high voltage to be applied to said coil whenever the coil current lags behind an amplitude commanded by said input signal.

2. The circuit of claim 1, wherein said causing means includes: a high voltage power supply, having an output; and means for coupling the high voltage output to the common bus whenever a rate of change of current flow through said gradient coil is not sufficiently large.

3. The circuit of claim 2, wherein said coupling means includes means for monitoring a gradient coil characteristic to generate a high-voltage-connection signal responsive to a gradient coil current flow parameter.

4. The circuit of claim 3, wherein the monitored characteristic is a resulting bus voltage, and the monitoring means includes means for providing the high-voltage-high-connection signal whenever a fixed portion of the potential at the output of a selected amplifier is less than a fixed portion of the potential on said common bus.

5. The circuit of claim 4, wherein the coupling means further comprises a high voltage switching means for applying said high voltage to said common bus responsive to a logic signal; and said providing means includes a comparator for providing the logic signal to enable closure of said high voltage switching means.

6. The circuit of claim 5, wherein said high voltage switching means includes: a semiconductor switching device having an input and a controlled-conduction circuit connected between said high-voltage power supply and said common bus and in which current flow is controlled by a signal at said input; and means for controlling the signal applied to said switching device input responsive to said logic signal.

7. The circuit of claim 6, further including a unidirectionally-conducting element connected in parallel with, and with reverse-poling to, said controlled-conduction circuit.

8. The circuit of claim 7, wherein said unidirectionally-conducting element is parasitic to said switching device.

9. The circuit of claim 8, wherein said switching device is an IGBT.

10. The circuit of claim 3, wherein the monitored characteristic is actual coil current, and the monitoring means includes means for providing the high-voltage-connection signal whenever actual coil current is less than the current commanded by the common input signal.

11. The circuit of claim 10, wherein the coupling means further comprises a high-voltage switching means for applying said high voltage to said common bus responsive to a logic signal; and said providing means includes a coil current monitor and a comparator for providing the logic signal to enable closure of said high voltage switching means whenever the output of the monitor is less than the magnitude of the common input signal.

12. The circuit of claim 11, wherein said high voltage switching means includes: a semiconductor switching device having an input and a controlled-conduction circuit connected between said high-voltage power supply and said common bus and in which current flow is controlled by a signal at said input; and means for controlling the signal applied to said switching device input responsive to said logic signal.

13. The circuit of claim 12, further including a unidirectionally-conducting element connected in parallel with, and with reverse-poling to, said controlled-conduction circuit.

14. The circuit of claim 13, wherein said unidirectionally-conducting element is parasitic to said switching device.

15. The circuit of claim 14, wherein said switching device is an IGBT.

16. The circuit of claim 1, wherein the output of each of the plurality of gradient power amplifiers is connected to a charge-storage element with each power amplifier and charged-storage element being connected in parallel to the common bus through a unidirectionally-conductive device.

17. The circuit of claim 1, wherein each of said switching elements is an IGBT.

18. The circuit of claim 1, wherein four of said switching elements are arranged in a full-bridge configuration.

19. The circuit of claim 16, wherein each of said switching elements is an IGBT.

20. The circuit of claim 19, said input includes a digital-to-analog converter for converting a digital data control signal to an analog signal, a positive detector and a negative detector for detecting polarity of the analog signal and thereby creating a switching signal, the switching signal being received by said means for operating the switching elements causing each of the switching elements to open or close depending on the polarity of the analog signal.

* * * * *